(12) United States Patent
Martinozzi

(10) Patent No.: US 8,576,639 B2
(45) Date of Patent: Nov. 5, 2013

(54) MEMORY DEVICE HAVING SWITCH PROVIDING VOLTAGE TO BIT LINE

(75) Inventor: Giulio Martinozzi, Cologno Monzese (IT)

(73) Assignee: Elpida Memory, Inc., Tokyo (JP)

( * ) Notice: Subject to any disclaimer, the term of this patent is extended or adjusted under 35 U.S.C. 154(b) by 208 days.

(21) Appl. No.: 13/176,337

(22) Filed: Jul. 5, 2011

(65) Prior Publication Data
US 2013/0010543 A1   Jan. 10, 2013

(51) Int. Cl.
*G11C 7/00* (2006.01)
(52) U.S. Cl.
USPC ............. 365/189.05; 365/201; 365/189.14; 365/189.15
(58) Field of Classification Search
USPC ............. 365/189.05, 201, 189.14, 189.15
See application file for complete search history.

(56) References Cited

U.S. PATENT DOCUMENTS 6,097,666 A * 8/2000 Sakui et al. ............... 365/230.06
6,819,596 B2 * 11/2004 Ikehashi et al. ........... 365/185.22

* cited by examiner

*Primary Examiner* — Son Dinh
(74) *Attorney, Agent, or Firm* — Morrison & Foerster LLP

(57) ABSTRACT

A memory device in which a circuit reads a cell condition. A terminal provides voltage to a bit line of the circuit via a switch. The circuit outputs and enables storage of a first logical value when the voltage provided from the terminal does not exceed a threshold value. The circuit outputs and enables storage of a second logical value when the voltage provided from the terminal exceeds the threshold value. The output and storage occurs in the absence of an electrical connection between the cell and circuit. The switch provides voltage supplied from the terminal to the bit line of the circuit. The voltage increases from a value which does not exceed the threshold to a value which exceeds the threshold.

20 Claims, 18 Drawing Sheets

MEMORY DEVICE HAVING SWITCH PROVIDING VOLTAGE TO BIT LINE

BACKGROUND OF THE INVENTION

1. Field of the Invention

The invention relates to a memory device, in particular, a Flash Nand memory device including a page buffer circuit.

2. Description of Related Art

Flash Nand memory device includes a memory cell and a page buffer which is used as a read circuit to temporarily store the logical value attributed to the cell threshold condition: the common way is to attribute a value 0 (programmed) or 1 (erased) depending on whether the cell driven by a read voltage on its gate contact is switched off or not.

If the cell is switched on, and the gate is driven at the read voltage, the cell conducts a current. Otherwise, the cell does not conduct a current. The system used to sense the cell current is to let a charged capacitor discharge in a fixed time: depending on whether the final voltage of the capacitor is lower or higher than a threshold value, the read cell is considered erased or programmed.

FIG. 1 shows the page buffer and the connection to a single cell: Cbl is the capacitor discharged by the cell's current (arrow 1) during the fixed time called evaluation time. Actually the Cbl is not a discrete device but the whole bit line, that is a long strip of metal. It is not the purpose of this invention to explain the read procedure adopted with such type of page buffer and architecture, what is relevant for the invention is that at the end of the evaluation time the bitline connected to the read cell, reaches a voltage value that depends on the starting voltage, the cell's current and the evaluation time itself.

Finally the bitline selector bsele (or bselo in case of odd page read) switches on and connects the selected bitline to the inner page buffer node called datab. Thanks to the charge sharing the datab voltage reaches the same value of the bitline (arrow 2) and if this value is high enough to switch on the mdata transistor (the condition is the typical mos switch on condition V(datab)=VGS(mdata)>VTH(mdata)) a pulse on readpb signal can easily drive the pre-charged latp node to ground (arrow 3), and force the page buffer latch to flip, otherwise the latp can't be discharged and remain high and so the page buffer latch maintains the starting value. This roughly the way the page buffer is used during a read operation as a transducer of a analog quantity (the final value of the bitline voltage) to a digital value (the final value of latp/latn nodes).

In a flash NAND device the number of the page buffer circuits in the page buffer block is the same size of the page, typically 4 KB (32768 bits), or more and thanks to the particular position of thee block in the device, attached to the nand matrix, the layout of the page buffer block makes impossible to access to the inner nodes of the circuits and the test of the circuit must be done using indirect measures.

One of the relevant information about the page buffer is its "0-reading threshold" (VTH-0), that is the bitline's voltage above which the circuit reads the cell as programmed (latp=0) while below the circuit reads the cell as erased (latp=1). FIG. 2 shows an ideal behavior of a page buffer read.

SUMMARY OF THE INVENTION

The present disclosure relates to a memory device which, in one embodiment, includes a circuit configured to read a condition of a cell and a terminal configured to provide voltage to a bit line of the circuit via a switch. The circuit is configured to, in the absence of an electrical connection between the cell and circuit, output and enable storage of a first logical value when the voltage provided from the terminal does not exceed a threshold value and to output and enable storage of a second logical value when the voltage provided from the terminal exceeds the threshold value. The switch is configured to provide voltage supplied from the terminal to the bit line of the circuit which increases from a voltage which does not exceed the threshold value to a voltage which exceeds the threshold value.

That is, according to an embodiment of the present invention, provided is a memory device comprising: a circuit being configured to read a cell condition and store a logical value attributed to the cell condition, an external voltage source being configured to provide a voltage to the circuit, and a switch being positioned between the external voltage source and the circuit, wherein the circuit is configured to output and store a logical value without being electrically connected to the cell if the switch is one and the external voltage source provides a voltage to the circuit through the switch.

Preferably, the circuit comprises a latch circuit being configured to convert an analog value to a digital value and store the digital value, a first node being coupled to the latch circuit, and a second node being configured to provide a voltage to the first node, wherein the switch is positioned between the external voltage source and the second node, and the external voltage source is configured to provide a voltage to the second node if the switch is on.

Preferably, the second node is shared by multiple circuits and each circuit is being configured to read a cell condition and store a logical value attributed to the cell condition.

In another embodiment of the present invention, provided is a method of testing a memory comprising performing a test operation by applying a first voltage to a circuit being configured to read a cell condition and store a logical value attributed to the cell condition, performing a read operation by reading the logical value that is outputted and stored by the circuit without being electrically connected to the cell, and repeating the test operation with a second voltage, the second voltage being higher than the first voltage.

Preferably, the test operation comprises setting a first voltage on a voltage source that is connected to a node by a switch, and applying the first voltage to the node if the switch is on, the node being shared by at least one circuit being configured to read a cell condition and store a logical value attributed to the cell condition.

Preferably, the method includes performing a determining operation to determine the circuit's threshold voltage, wherein the circuit outputs and stores a first logical value if the first voltage is higher than the circuit's threshold voltage, and the circuit outputs and stores a second logical value if the first voltage is lower than the circuit's threshold voltage.

The present disclosure further relates to a nonvolatile memory which, in one embodiment, includes a page buffer including a flip-flop, a bit line coupled to the flip-flop, a bias node coupled to the bit line, an external pad, and a switch between the pad and the bias node, controlled by a test signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
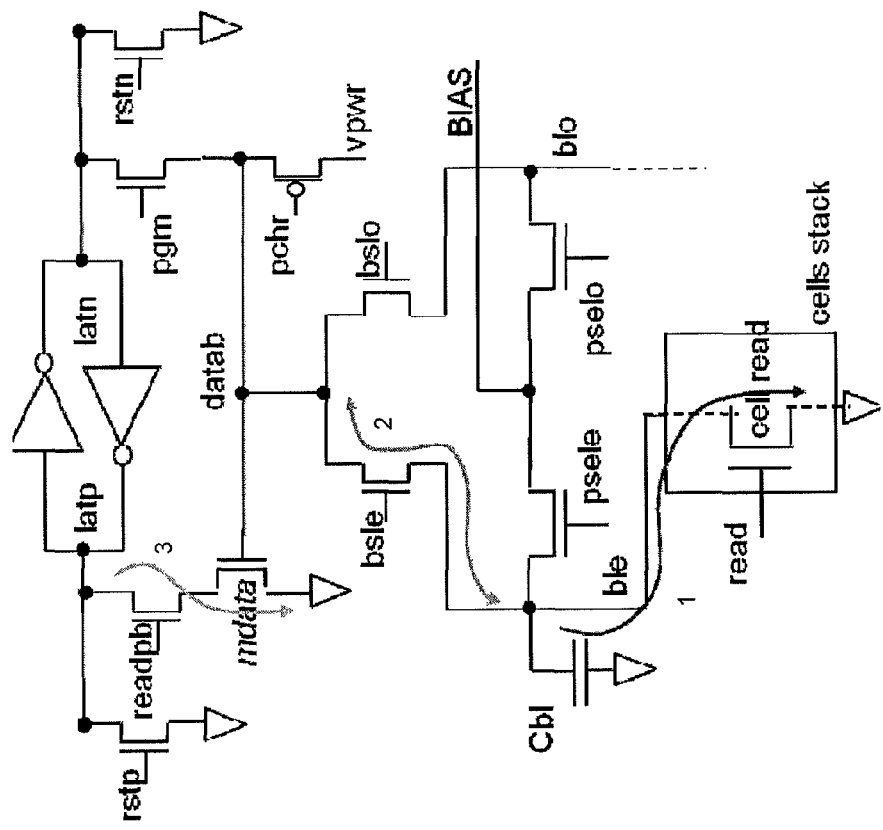
FIG. 1 illustrates an example of the page buffer and the connection to the cell.
Figure 2:
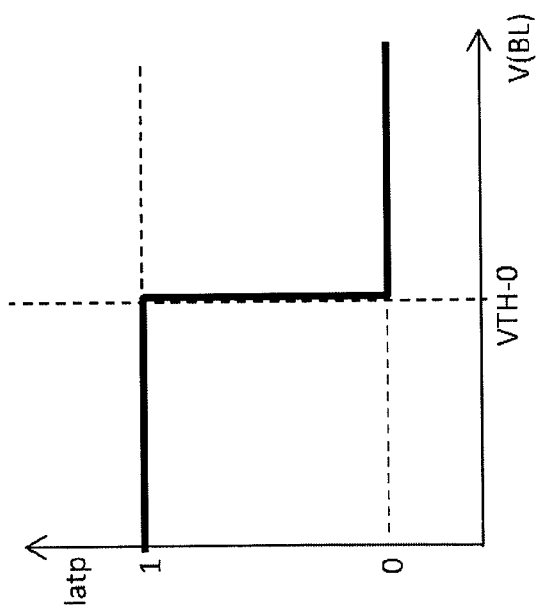
FIG. 2 illustrates an example of the latp value versus the bitline voltage showing the 0-reading threshold.
Figure 3:
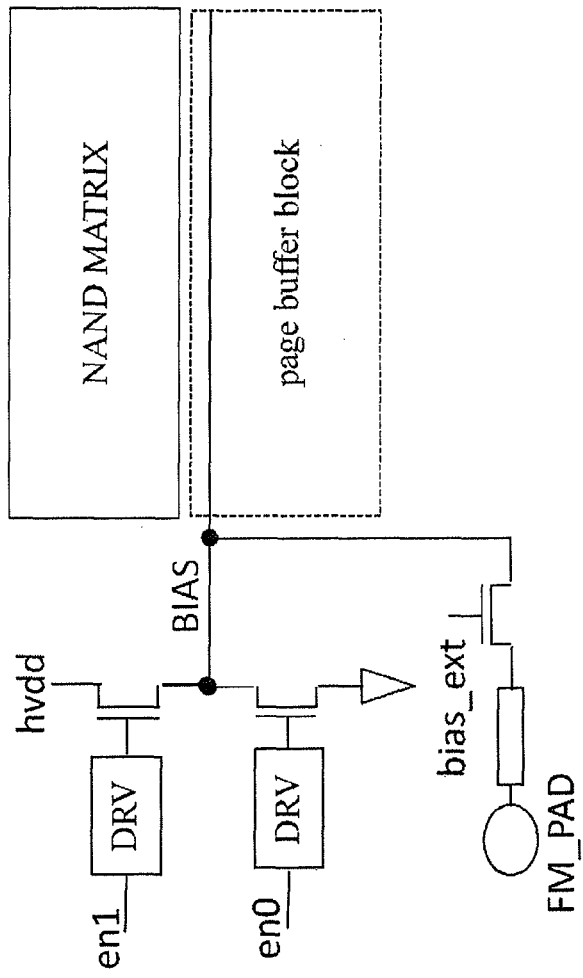
FIG. 3 illustrates an example of the connection between the FM_PAD and the bias node.

FIG. 3 shows a brief structure of a semiconductor memory device of an embodiment for the present invention.

The memory device includes a NAND matrix, a page buffer block, a driver circuit, an external pad FM_PAD and a switch connected between a bias common node and the external pad. The switch has a control gate supplied with a test signal to achieve a test mode of the embodiment. The driver circuit includes two transistors connected in series between two power source terminals, for example, hvdd and GND, and used for a normal driving. The transistors are driven by the respective driver DRV. The drivers DRV are driven by signals en1, en0, respectively. During the test the normal driving system of BIAS node is disabled (en1=en0=0), a level of the bias_ext test signal is reversed to turn on the switch constructed by a MOS transistor. The bias common node is driven by an external voltage supplied with the pad FM_PAD to perform an external drive. The device may be constructed by single semiconductor chip. The external voltage may be supplied from an outside of the semiconductor chip by an external driver (not shown), which includes a power source producing the external voltage, for example provided in a tester.

The device permits to access to the bitline nodes so to drive them with a fixed voltage and to measure the VTH-0 of each page buffer in the device, by repeating a fake read operation sweeping the bitline voltage. That is, when a connection is established between the external driver and the internal node bias via the FM_PAD, you can drive the driving signals of the page buffer block in order to make a fake read with the bitline voltage fixed by the external source.

The circuit variations of each page buffer circuit affect the memory device reliability, and thus knowing the variations of the page buffer circuits may help determine the memory device reliability as a whole. However, it is not easy to directly measure the variations because it is difficult to directly access the inner nodes of the page buffer circuits due to the circuit layout. The embodiment permits to directly measure the circuit variations of each page buffer circuit.

Figure 4:
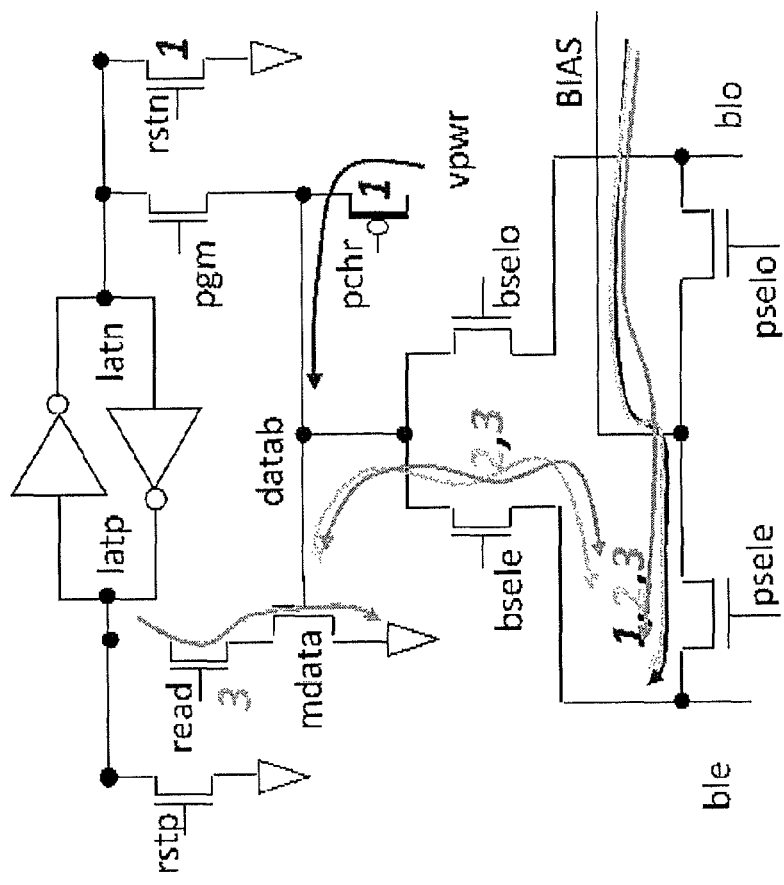
FIG. 4 illustrates an example of the main three phases of fake read algorithm.

FIG. 4 shows the page buffer and the driving flows, basically there are three phases: first a reset pulse e of the page buffer latch, a charge of datab node through the pchr transistor and the bitline charge to the wanted voltage value via bias and psele mos (this is to simulate the read of a even page, you can choose to charge the odd bitline through the pselo mos too not to leave the odd bitlines floating during this sequence). The second phase is to disconnect the charging transistor pchr and drive the bsele at the wanted value while keeping the bitlines still connected to the bias, and then after a desired time the read strobe will end the sequence in the third phase of the fake read operation.

Figure 5:
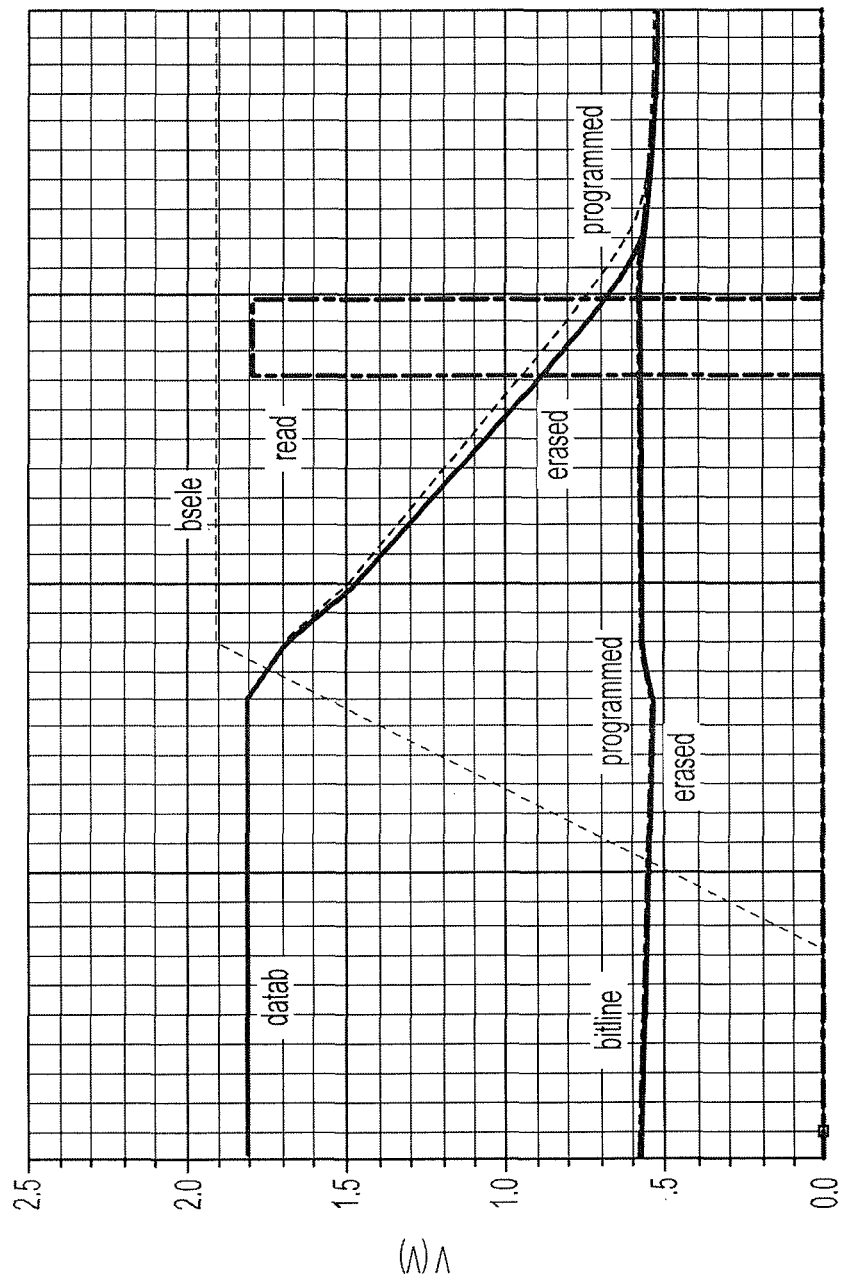
FIG. 5 illustrates an example of a simulation of the end of read operation, with the bitline and related datab node line designated "erased" belonging to an erased cell while the lines designated "programmed" are ones to a programmed.

FIG. 5 shows the results of a read simulation sweeping the cell threshold voltage, the lines (bitline and datab) designated "erased" belong to a cell read as erased while the lines designated "programmed" belong to a cell read as programmed.

Figure 6:
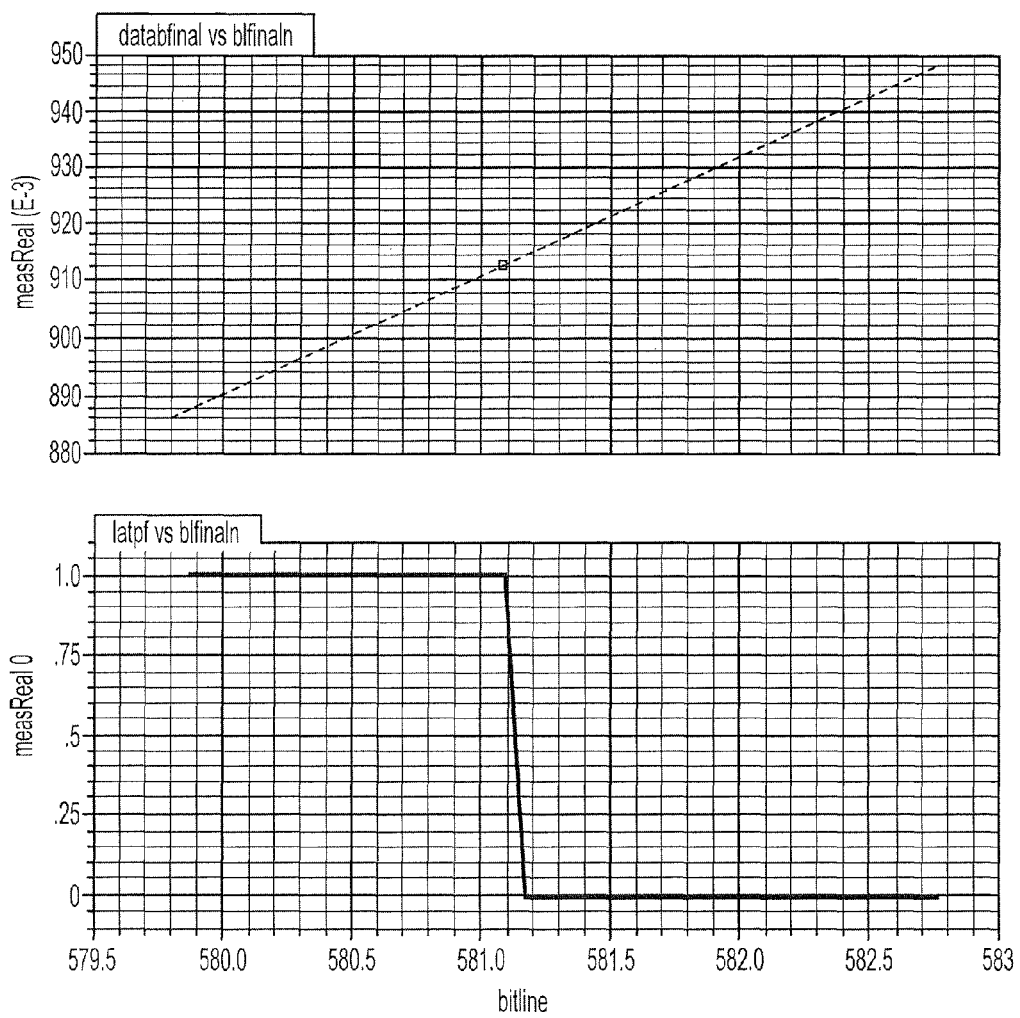
FIG. 6 illustrates an example of the sweep results of a bitline voltage, the datab value and the value read by the page buffer showing a VTH-0 of about 0.581V.

FIG. 6 shows the results of all the steps: on the x-axis there is the bitline voltage measured at the end of the read operation while on the y-axis there are the value read by the page buffer and the datab voltage at the read strobe.

Figure 7:
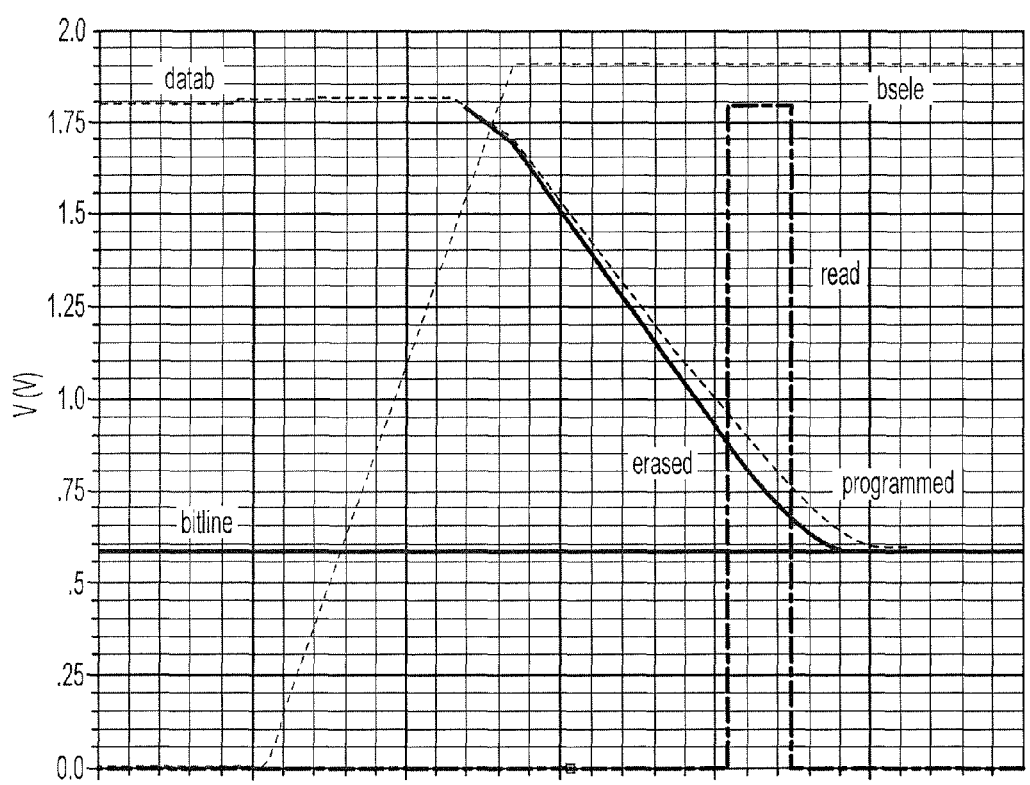
FIG. 7 illustrates an example of the bias sweep results.
Figure 8:
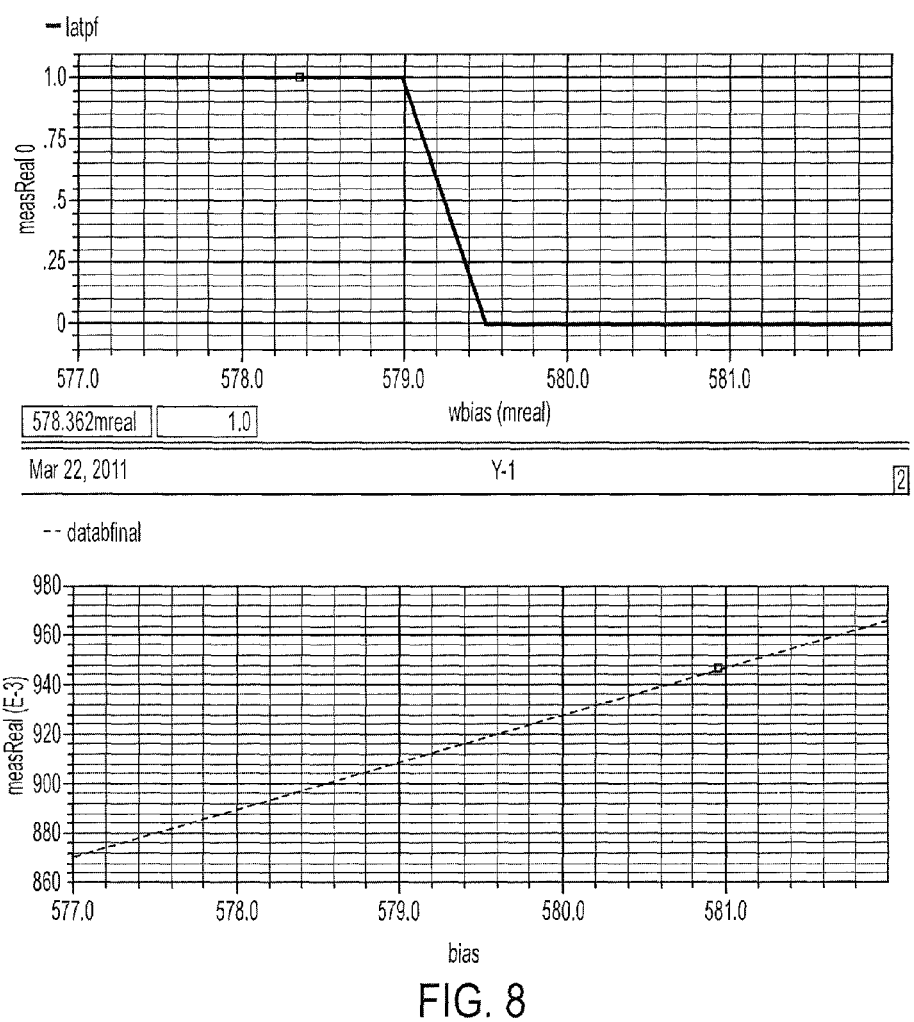
FIG. 8 illustrates an example of the bias sweep results with the e measured VTH-0 is 0.579V.

FIG. 7 and FIG. 8 show the simulation of the measure of the VTH-0 using the proposed embodiment, it has been swept the bias voltage and repeated the fake read algorithm. As shown the results are almost the same.

Figure 9:
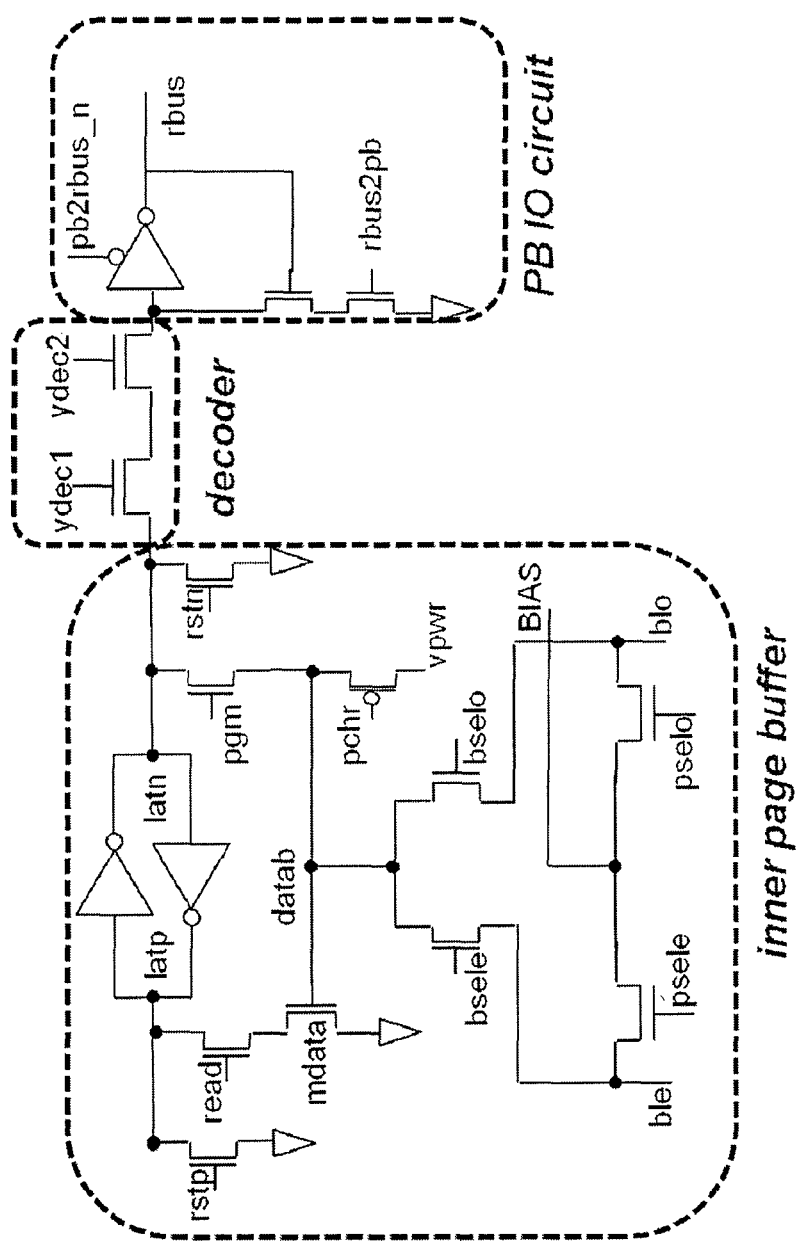
FIG. 9 illustrates an example of the page buffer circuit with the inner core, the decoder and the I0 circuit.
Figure 10:
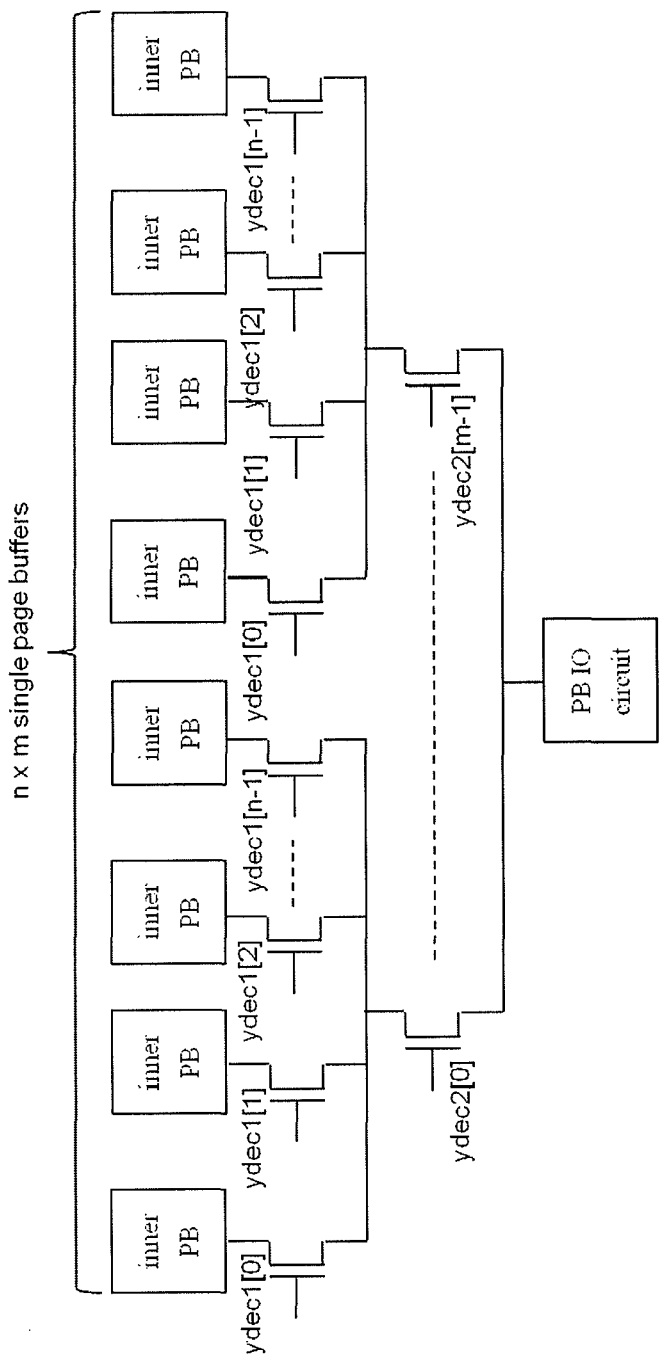
FIG. 10 illustrates an example of the page buffer decoder with 2 decoding stages of m and n levels.
Figure 11:
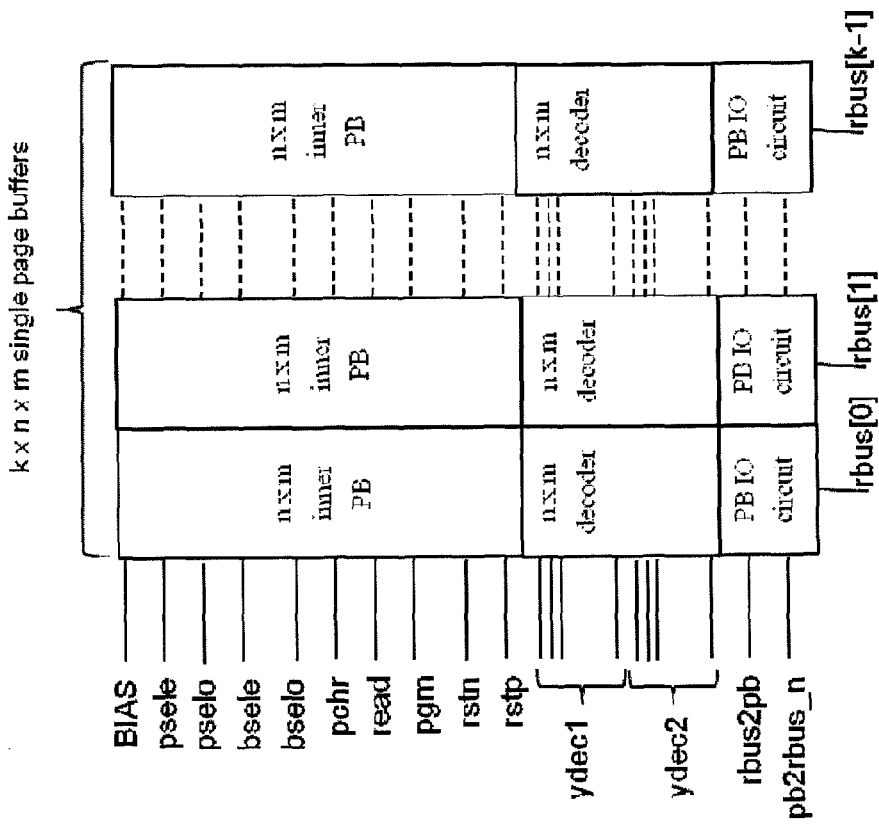
FIG. 11 illustrates an example of the page buffer block with k*n*m inner page buffers.

The page buffer is the circuit used in read and write operations of a nand cell it is not used as a single circuit but usually it belongs to a page buffer block circuit which is built by several Inner page buffers connected through a decoding system to a page buffer 10 circuit, as shown in FIGS. 9,10,11.

The BIAS node as all input of inner page buffer is connected to all the page buffers and it is used in this embodiment to reach and set an internal node of each inner page buffer (datab) to a well known value.

Figure 12:
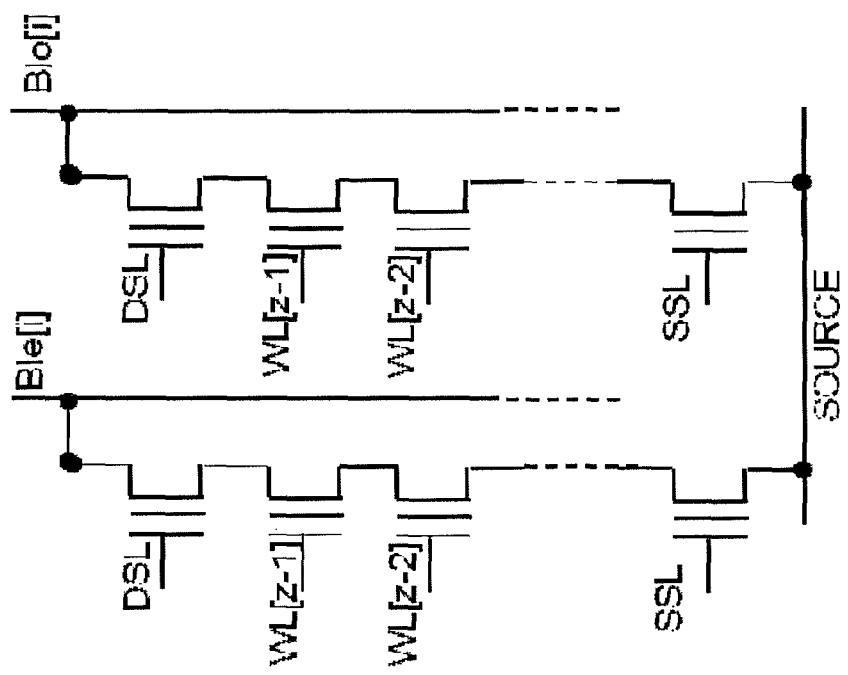
FIG. 12 illustrates an example of the nand string with z word lines per string, a drain selector and a source selector.
Figure 13:
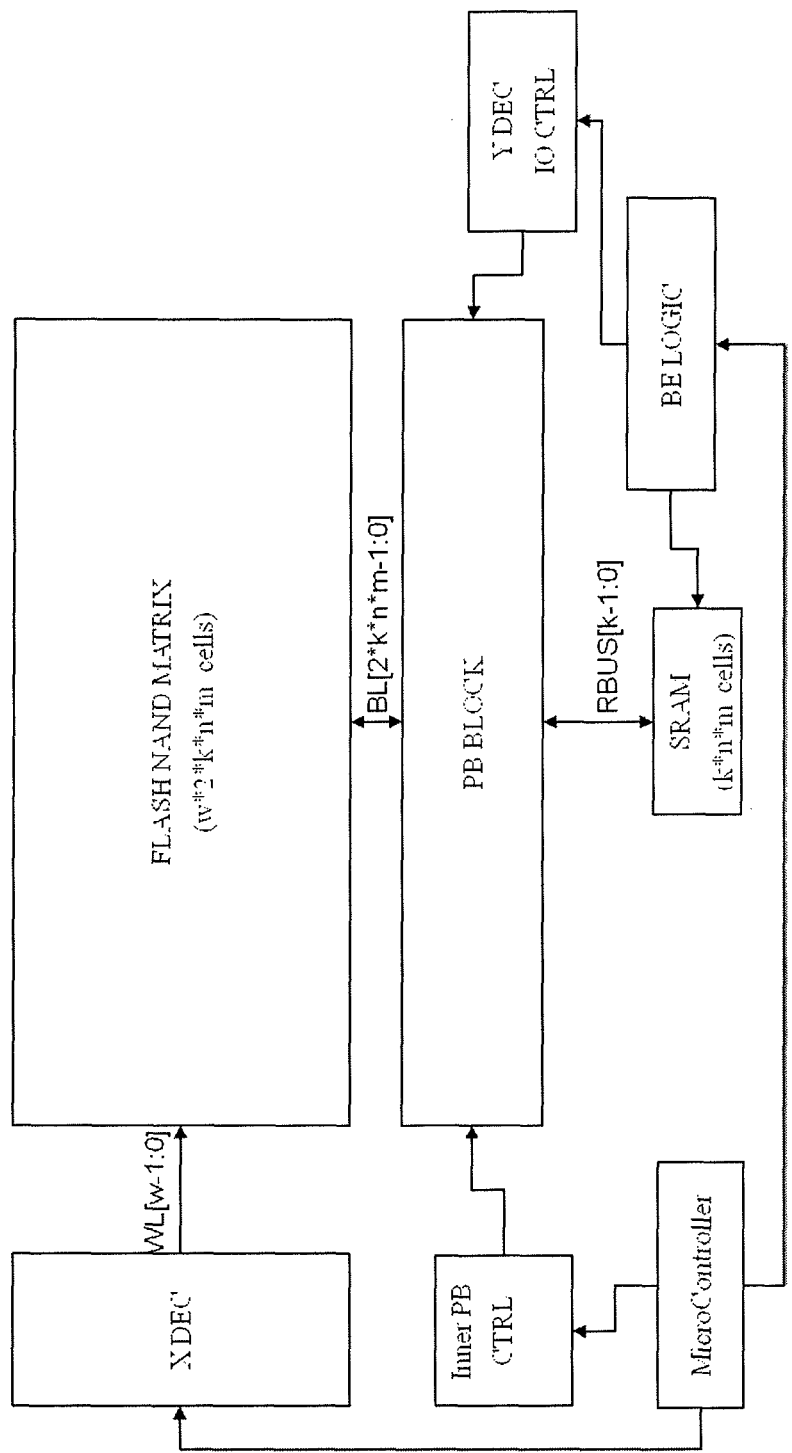
FIG. 13 illustrates an example of the Nand matrix with total w word lines, 2*k*n*m bitlines and so with total page buffer number of k*n*m.

FIGS. 12 and 13 show the nand matrix built by several nand strings and the connection between the page buffer block and the peripheral circuits used in read and write operations.

Figure 16:
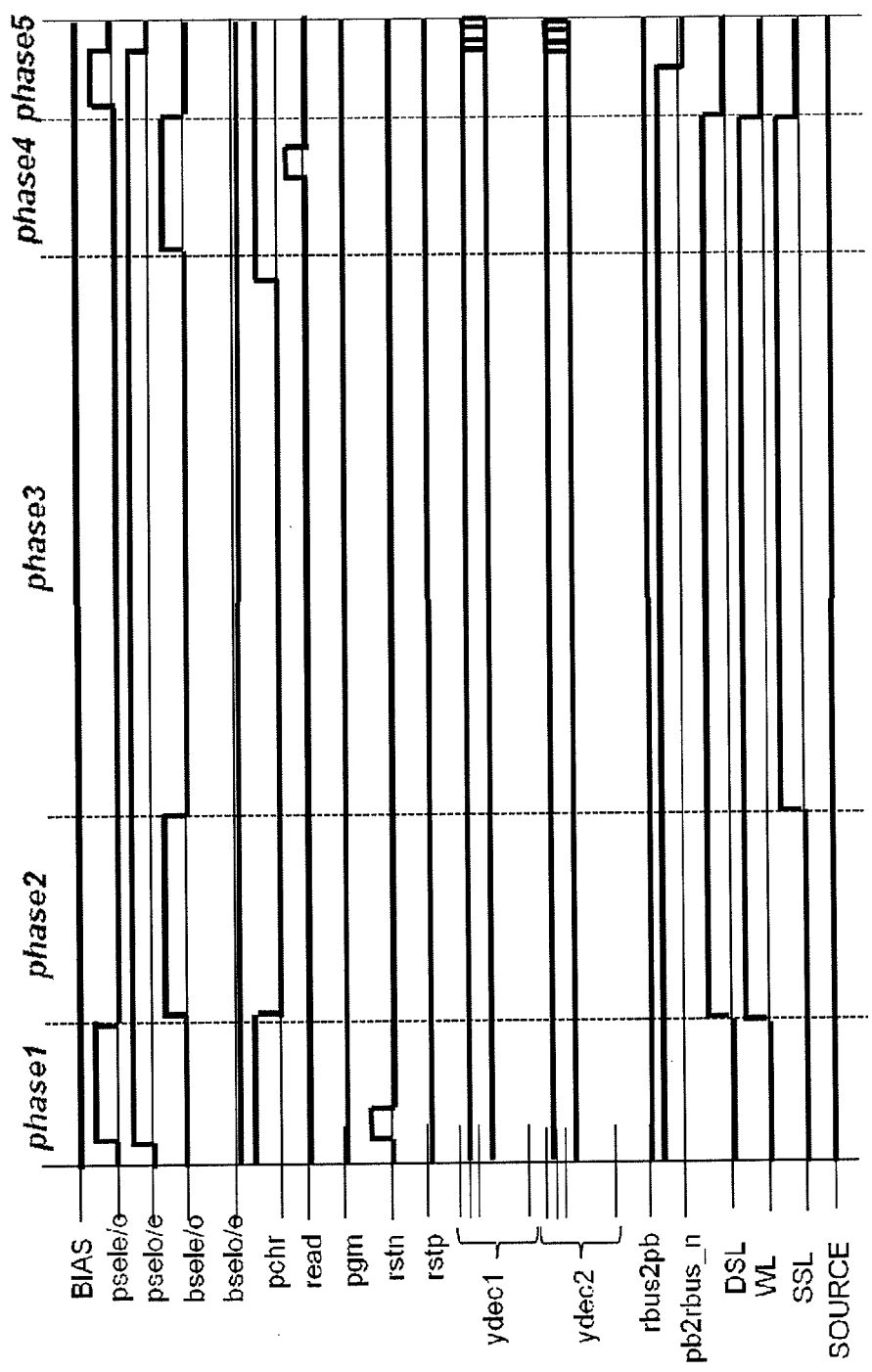
FIG. 16 illustrates an example of standard read timings.

Referring to FIG. 16 the read operation can be split into S phases: phase 1 is for bitlines equalizations (both psele and pselo high and bias driven to gnd) and page buffer latch initialization (pulse on rstn), then phase 2 starts the bitline precharge. Here, depending on which page even or odd is selected to be read, the selected psel is put to gnd while the unselected one remains high, on the contrary the selected bsel is switched on while the unselected bsel is kept to gnd and the precharge pmos is switched on (pchr), thank to this the selected bitline is charged. At the same time the x decoder is driven to charge the word lines and the dsl too while the ssl is still at gnd.

Phase 3 is called evaluation phase: the charged bitline is left floating (selected bsel to gnd) and the ssl is activated, so if the cell is erased the bitline can discharge while if the cell is programmed the bitline voltage remain high. Phase 4 is the sensing phase, when the bitline is connected through a new bsel activation to internal node mdata left floating by the previous disconnection of precharge pmos, here if the bitline's voltage is high (cell programmed) the mdata's voltage remain high and so a read pulse can flip the page buffer latch, on the contrary if the bitline is discharged the mdata's voltage is low and a read pulse does not flip the latch. Phase 5 discharges all bitlines and wordlines and makes a data transfer between the page buffer and the sram. In this example is used a typical read procedure and a single latch page buffer with a ram device, but it is possible to use the same embodiment in other page buffer architecture and using other read procedure, because the core of the read operation of a flash nand cell is always a digitalization of the analog value of the voltage reached by the bitline at the end of evaluation phase.

Figure 14:
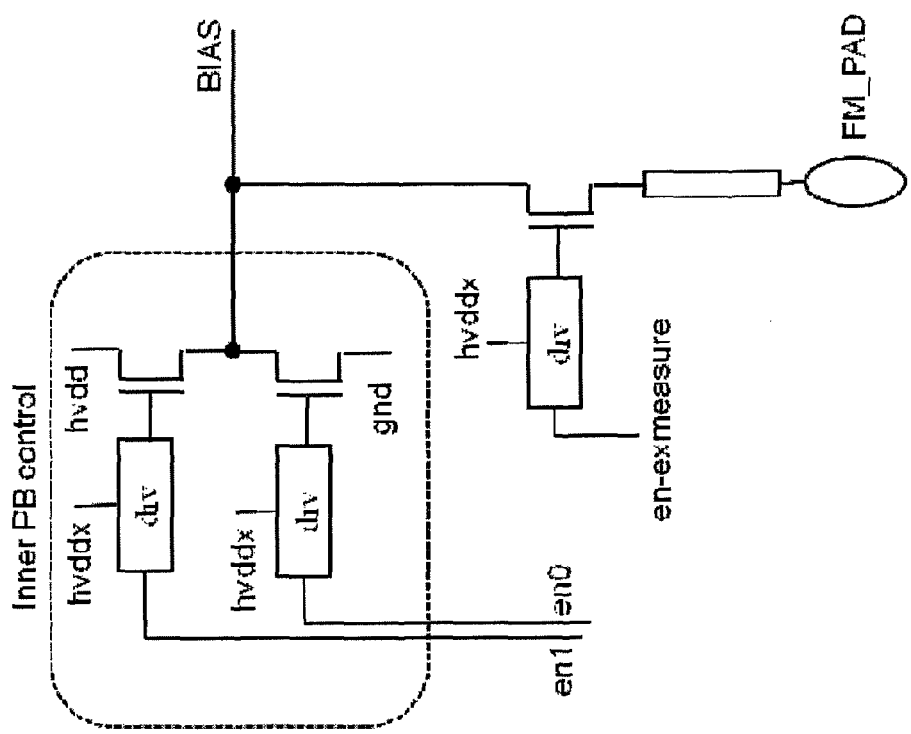
FIG. 14 illustrates an example of the bias driver as a part of inner PB control and the external measure system.
Figure 15:
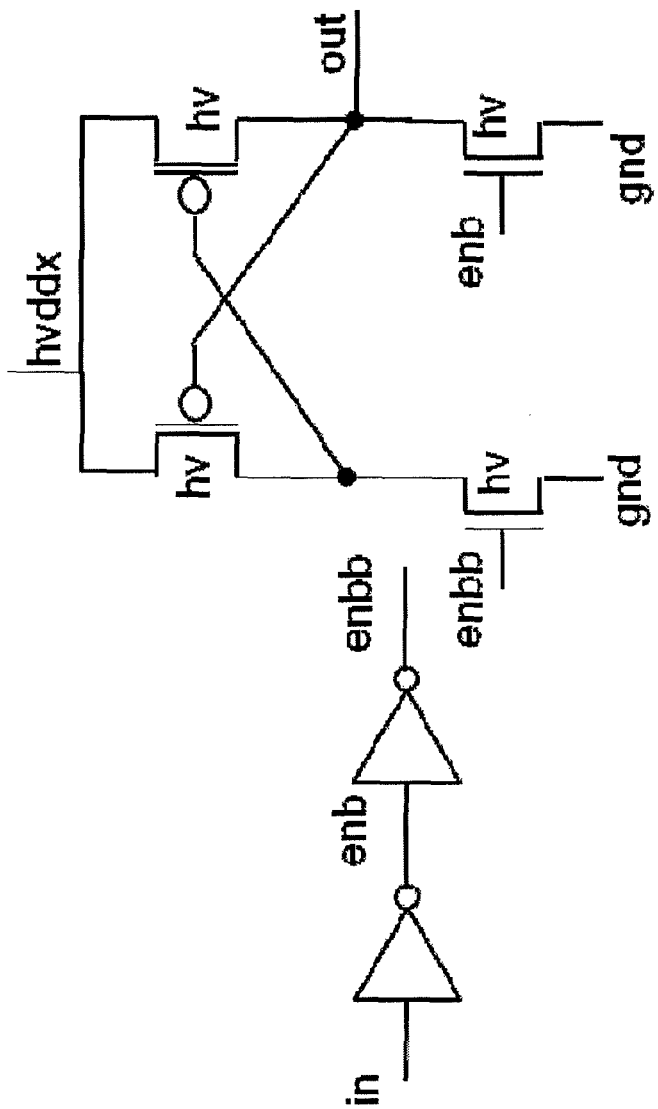
FIG. 15 illustrates an example of a typical elevator (the dry circuit in FIG. 14) used to increase the input voltage (low voltage level) to high voltage level of hvddx, with Out waveform being the same as In but for the higher level.

FIGS. 14 and 15 show the bias driver and a typical elevator used to increase the input signal higher enough to correctly drive the switching mos. During read operation the en0 is '1' and enn1 is '0' and the bias node is kept to gnd. The other connection to hvdd (hvdd<hvddx) is used in program operation but this function is not explained here because it is not necessary. The core of the embodiment is the additional bias connection to the external pad FM_PAD through the switching mos activated during test mode by the en-exmeasure signal (driven for example by the micro controller).

Figure 17:
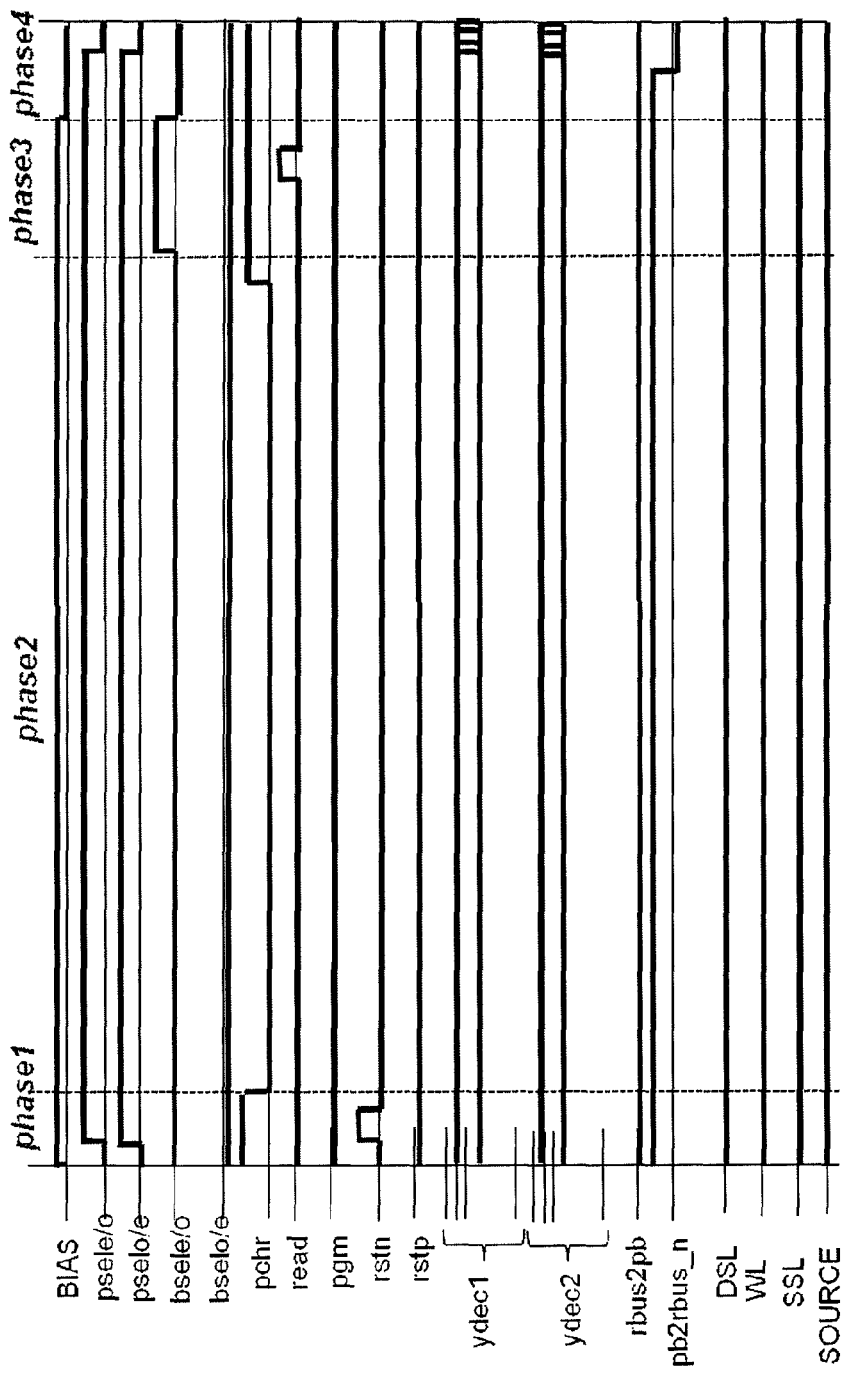
FIG. 17 illustrates an example of fake read timings with external bias driving test enabled.

FIG. 17 shows the timing of a fake read procedure to access to the mdata of all page buffer and so after a read pulse measure the threshold value of each page buffer. Phase 1 resets all the page buffer, phase 2 keeps the mdata to vpwr and charge the bitlines to a desired value via the FM_PAD, en-exmeasure=1, en0=0, en1=0 to set the bias voltage, and pselе=pselo=high, and then phase 3 is the same sensing phase of the real read procedure (pchr deactivated, one of bsel activated and read pulse) followed by the same discharge and data transfer phase.

Figure 18:
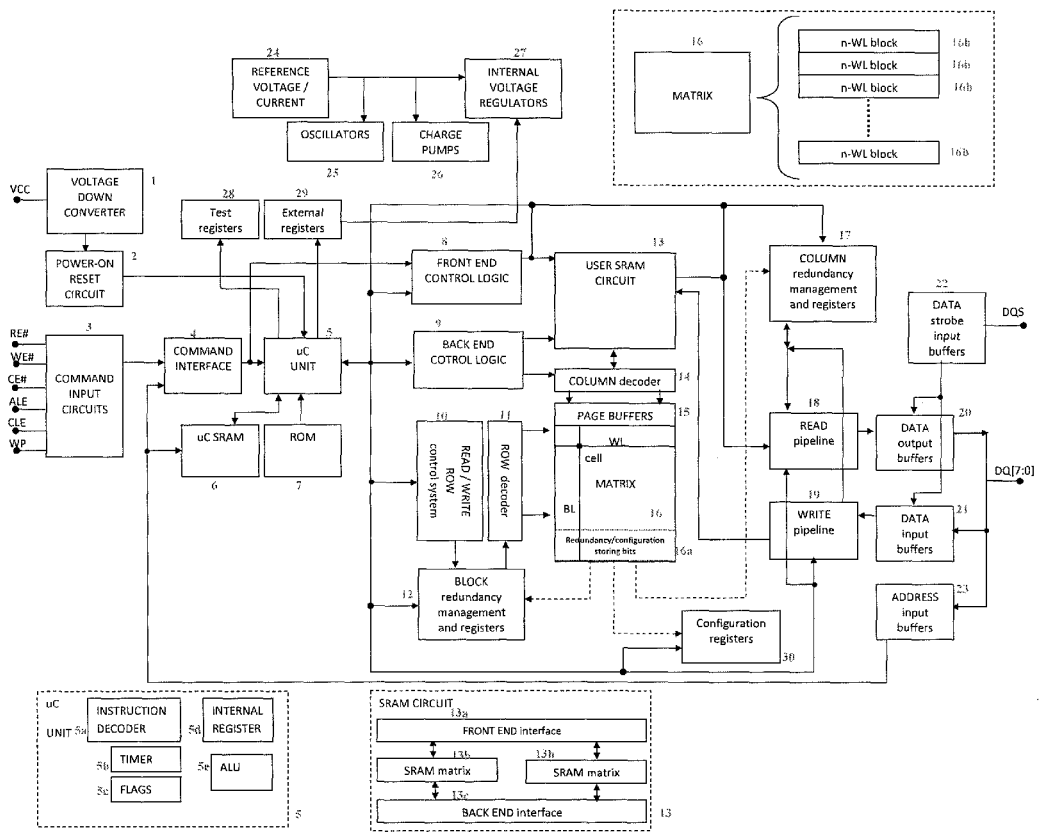
FIG. 18 illustrates an example of main blocks of a nand device.

The embodiment can be used in such test mode: 1) Set a starting voltage on FM_PAD. 2) Execute the fake read algorithm. 3) Make an output of the data read. 4) Increase the voltage used on FM_PAD and repeat from point 2. In this way it can be built a plot of data read versus voltage set as in FIG. 8 upper graph. FIG. 18 shows a nand device and the internal blocks, embodiment involves blocks number 5,9,15.

What is claimed is:

1. A memory device comprising:
a circuit configured to read a condition of a cell, and
a terminal configured to provide voltage to a bit line of the circuit via a switch,
the circuit being configured to, in the absence of an electrical connection between the cell and circuit, output and enable storage of a first logical value when the voltage provided from the one terminal does not exceed a threshold value and to output and enable storage of a second logical value when the voltage provided from the one terminal exceeds the threshold value, and
the switch being configured to provide voltage supplied from the terminal to the bit line of the circuit which increases from a voltage which does not exceed the threshold value to a voltage which exceeds the threshold value.

2. The device of claim 1 wherein the cell comprises a nonvolatile memory cell.

3. The device of claim 1 wherein the circuit comprises:
a latch circuit configured to convert an analog value to a digital value and enable storage of the digital value,
a first node associated with the latch circuit, and
a second node configured to provide voltage to the first node,
the terminal being configured to provide voltage to the second node via the switch,
the latch circuit being configured to output and enable storage of a digital value without requiring an electrical connection with the cell when voltage is provided from the terminal to the second node via the switch.

4. The device of claim 3 wherein the second node is shared by at least two circuits, each of the at least two circuits being configured to read a cell condition and enable storage of a logical value associated with the cell condition.

5. The device of claim 1 wherein the terminal is configured to be connected to an external voltage source.

6. A method of testing a memory device comprising:
performing a test operation by applying a first voltage to a circuit configured to read a cell condition and enable storage of a logical value associated with the cell condition,
performing a read operation by reading the logical value that is outputted and stored by the circuit without requiring an electrical connection with the cell, and
repeating the test operation with a second voltage, the second voltage being higher than the first voltage.

7. The method of claim 6 wherein the test operation comprises:
setting a first voltage on a voltage source that is connected to a node, and
causing the voltage source to apply the first voltage to the node,
wherein the node is shared by at least two circuits, each of the at least two circuits being configured to read a cell condition and enable storage of a logical value associated with the cell condition.

8. The method of claim 6 comprising performing a determining operation to determine a circuit's threshold voltage,
wherein the circuit outputs and enables storage of a first logical value if the first voltage is higher than the circuit's threshold voltage, and
the circuit outputs and enables storage of a second logical value if the first voltage is lower than the circuit's threshold voltage.

9. The method of claim 6 wherein the cell comprises a nonvolatile memory cell.

10. The method of claim 7 wherein the voltage source comprises an external voltage source.

11. A device comprising:
a first bit line associated with a first memory cell;
a second bit line associated with a second memory cell;
a bias node;
a first transistor coupled between the bias node and the first bit line;
a second transistor coupled between the bias node and the second bit line;
a sensing transistor including a gate;
a third transistor coupled between the gate of the sensing transistor and the first bit line;
a fourth transistor coupled between the gate of the sensing transistor and the second bit line;
an external pad; and
a switch between the pad and the bias node, controlled by a test signal.

12. The device of claim 11, further comprising:
a latch circuit including a first node and a second node;
a read enable transistor coupled serially to the sensing transistor between the first node of the latch and a ground potential; and
an output circuit coupled to the second node of the latch circuit to read a condition of the latch circuit.

13. The device of claim 12, further comprising:
a precharge transistor coupled to the gate of the sensing transistor to charge voltage to the gate of the sensing transistor.

14. The device of claim 12, further comprising:
a program enable transistor coupled between the second node of the latch circuit and the gate of the sensing transistor.

15. The device of claim 11, wherein the sensing transistor is configured to be conductive or non-conductive, in the absence of an electrical connection to the first and second memory cells, according to voltage supplied from the pad to the gate of the sensing transistor.

16. The device of claim 15, wherein the voltage supplied from the pad to the gate of the sensing transistor increases from a voltage which does not exceed a threshold value of the sensing transistor to a voltage which exceeds the threshold value of the sensing transistor.

17. The device of claim 11, wherein each of the first and second memory cells is a nonvolatile memory cell.

18. The device of claim 11, wherein each of the first and second memory cells is a NAND type flash memory cell.

19. The device of claim 11, wherein the first memory cell is coupled to the first bit line via a first select transistor, and where the second memory cell is coupled to the second bit line via a second select transistor, gates of the first and second memory cells being coupled to each other, and gates of the first and second transistors being coupled to each other.

20. The device of claim 11, wherein the switch circuit includes a transistor coupled between the pad and the bias node and including a gate supplied with the test signal.

* * * * *